United States Patent [19]

Hayashi et al.

[11] Patent Number: 4,868,632
[45] Date of Patent: Sep. 19, 1989

[54] NONVOLATILE SEMICONDUCTOR MEMORY

[75] Inventors: Yutaka Hayashi, Tsukuba; Itsunari Hayabuchi, Yokohama; Tatsuo Tsuchiya, Kawagoe; Seiichi Ishihara, Sayama, all of Japan

[73] Assignees: Director General of Agency of Industrial Science and Technology; Research Development Corporation of Japan; Citizen Watch Co., Ltd., all of Tokyo, Japan

[21] Appl. No.: 216,826

[22] Filed: Jul. 8, 1988

[30] Foreign Application Priority Data

Jul. 31, 1987 [JP] Japan .................... 62-189987

[51] Int. Cl.$^4$ .................... H01L 29/34; H01L 29/78
[52] U.S. Cl. .................... 357/54; 357/6; 357/23.5; 357/23.15
[58] Field of Search ............ 357/6, 23.5, 23.15, 357/54; 365/185; 437/241, 243, 920

[56] References Cited

U.S. PATENT DOCUMENTS 4,519,051  5/1985  Fuji .................... 357/23.5
4,618,541 10/1986  Forouhi et al. .................... 357/54

FOREIGN PATENT DOCUMENTS

56-8881  10/1981  Japan .................... 357/23.5
60-60770  8/1985  Japan .................... 357/23.5
62-14474  1/1987  Japan .................... 357/23.5

Primary Examiner—J. Carroll
Attorney, Agent, or Firm—Koda and Androlia

[57] ABSTRACT

In an MONOS type nonvolatile semiconductor memory comprising a channel forming semiconductor region between source and drain regions in a surface of a substrate; a tunnel insulating film formed on the channel forming semiconductor region in the surface of the substrate, the tunnel insulating film permitting charge-injection; a silicon nitride film formed as a second insulating film on the tunnel insulating film; a silicon oxide film formed as a third insulating film; and a conductive electrode formed on the silicon oxide film, the silicon nitride film has a composition close to a stoichiometric value of $Si_3N_4$ at a portion near an interface with the tunnel insulating film and has a composition of excess silicon at a portion of the thickness of the same film except near the interface with the tunnel insulating film.

4 Claims, 7 Drawing Sheets

BAND DIAGRAM AT ERASE TIME

NONVOLATILE SEMICONDUCTOR MEMORY

FIELD OF THE INVENTION

This invention relates to a layered structure of gate insulating film layers in a nonvolatile semiconductor memory.

DESCRIPTION OF THE RELATED ART

In the past, the following types of nonvolatile semiconductor memories have been known: an MNOS (metal-nitride-oxide-semiconductor) type memory and an MAOS (metal-alumina-oxide-semiconductor) type memory using spontaneous electron traps (hereinafter called "traps") at the interface between different types of insulating films; and a floating gate type memory using the formation of artificial potential wells. For injecting carriers into the traps or the floating gate, these types of memories use a Fowler-Nordheim tunneling current or a direct tunneling current across insulating films formed on a silicon substrate, and in order to enhance the tunneling probability, they generally require a 20 V or more voltage for writing (erasing). In order to decrease the writing (erasing) voltage, in the type using the traps at the interface between the different types of insulating films, it is considered to reduce the film thickness of a silicon nitride film or alumina film which is a second layer gate insulating film. However, owing to the phenomenon of reemission of trapped carriers from the second layer gate insulating film, the difference between the threshold voltages at the time of writing and erasing, that is, a memory window, is reduced, and furthermore, the injection of carriers from the gate electrode side occurs, and as a result the memory retention characteristics will deteriorate and an unnecessary writing may occur at the time of read-out. Thus, the writing (erasing) voltage cannot sufficiently been reduced so far.

On the other hand, in a memory as an example of a CONIS (conductive gate-oxide-nitride-insulator-semiconductor) structure, the surface of a silicon nitride film to be used as the second layer gate insulating film of the MNOS type memory is thermally oxidized to produce an MONOS (metal-oxide-nitride-semiconductor) type, for example, Japanese Patent Application No. 60-152187 by the applicants of the present application, et al. In this type of memory, a silicon oxide film having a barrier height high enough to prevent the injection of carriers from the gate electrode side is provided as a third layer gate insulating film, thus making it possible to reduce the entire gate insulating film thickness to around 10 nm and to reduce the writing (erasing) voltage to 10 V or less.

However, in either MNOS type or MONOS type, the erasing speed is always slower several times than the writing speed, and this fact prevents the system from increasing the entire speed.

In the MONOS type memory using a silicon nitride film uniformly composed of excess silicon for the second layer gate insulating film, proposed by the applicants of the present application, et al (Japanese Patent Application No. 60-152187), memory retention characteristics have been improved, but measures to increase the erasing speed have not sufficiently been taken.

In order to increase the erasing speed, to be brief, the thicknesses of the gate insulating films, especially, the thickness of the tunnel insulating film may be reduced. However, this is not preferable because the memory retention characteristics will be deteriorated by a reverse tunneling effect.

SUMMARY OF THE INVENTION

The object of the present invention is to provide a nonvolatile semiconductor memory in which the aforementioned defects have been removed and the erasing speed has been accelerated to the level of the writing speed without sacrificing the memory retention characteristics. That is to say, the present invention provides a gate insulating film structure which contributes greatly to an increase in the erasing speed and which is an improvement upon the invention of the above-mentioned Japanese Unexamined Patent Application No. 60-152187 made by the same applicants, et al. concerning an MONOS memory using a silicon nitride film uniformly having a composition of somewhat excess silicon for the second layer gate insulating film, in which memory retention characteristics have been improved.

According to the present invention, as the second layer gate insulating film, a silicon nitride film is created so that it has a composition of excess silicon near the middle of the thickness of the film and a composition closer to a stoichiometric value of $Si_3N_4$ near the interface with the tunnel insulating film. Exactly speaking, the present invention provides an MONOS type nonvolatile semiconductor memory comprising a channel forming semiconductor region between source and drain regions in a surface of a substrate; a tunnel insulating film formed on the surface of the channel forming semiconductor region in the substrate, the tunnel insulating film permitting charge-injection; a silicon nitride film formed as a second insulating film on the tunnel insulating film; a silicon oxide film formed as a third insulating film; and a conductive electrode formed on the silicon oxide film; the silicon nitride film having a composition close to a stoichiometric value of $Si_3N_4$ at a portion near an interface with the tunnel insulating film and having a composition of excess silicon at a portion of the same film except near the interface with the tunnel insulating film, preferably near the middle of the same film. The substrate can be either p or n type semiconductor substrate and also can be of semiconductor film on insulator type.

In this connection, if the composition of the silicon nitride film varies either gradually or in at least two steps in stepwise way, the object of the present invention can be accomplished. In addition, there is no special limitation on the composition near the oxide film at the top of the silicon nitride film (the oxide film is formed as the third insulating film).

DETAILED DESCRIPTION OF THE PREFERRED EMBODIMENTS

Figure 1:
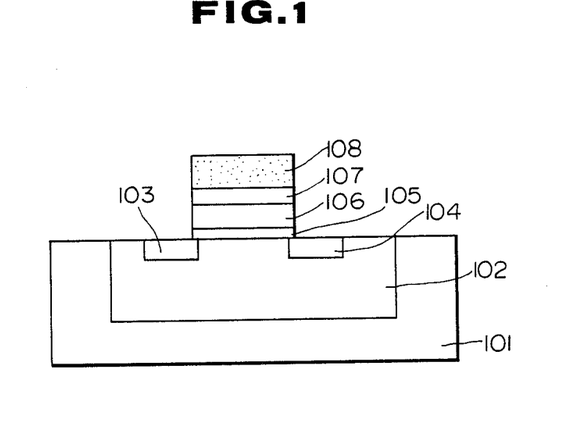
FIG. 1 is a sectional view of the structure of the present invention which has been applied to a field-effect transistor.

One of the embodiments according to the present invention is shown in FIG. 1.

FIG. 1 shows a field-effect transistor fabricated by providing n+ source and drain impurity regions in the structure of the present invention In an n-type silicon substrate 101, a p− region 102 as a channel forming semiconductor region is made, and then successively formed are a tunnel insulating film 105 which comprises a silicon oxide film about 2.8 nm in thickness; a silicon nitride film 106; a silicon oxide film 107 produced by thermally oxidizing the silicon nitride film 106; and a conductive electrode 108 which comprises polysilicon, and after a photoetching process, n+ impurity layers 103 and 104 are formed. The channel forming semiconductor region can be a surface portion of the semiconductor substrate itself.

Figure 2A:
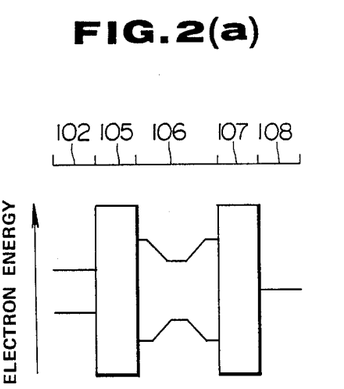
FIGS. 2A, 2B, 2C and 2D are schematic views illustrating structures of the present invention in band diagram.
Figure 2B:
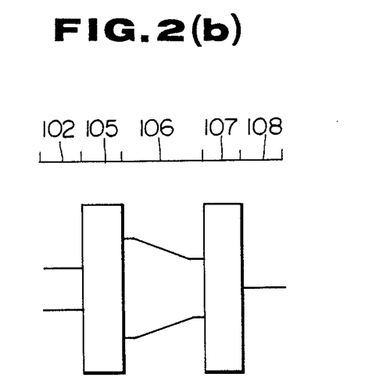

In FIGS. 2A and 2B, the structures of the present invention are schematically shown in band diagram. In FIG. 2, the numerals above each of the band diagrams correspond to the channel forming semiconductor region, the tunnel insulating film 105, the silicon nitride film 106, the silicon oxide film 107 and the conductive electrode 108, respectively. In FIG. 2A, for the channel forming semiconductor region 102, the bandgap $Eg=1.1$ eV; for the tunnel insulating film 105 and the thermally oxidized silicon oxide film 107, $Eg=7.9$ eV, respectively; and for the portion of the silicon nitride film 106 having a composition close to the stoichiometric value near the tunnel insulating film 105 and the portion of the silicon nitride film 106 having a composition close to the stoichiometric value near the thermally oxidized silicon oxide film 107, Eg is about 5.1 eV, respectively. As the composition becomes excess silicon, the band gap becomes small and approaches to about 1.1 eV of the band gap of silicon.

In FIG. 2, in the band structure of each silicon nitride film 106, the portion of a small bandgap represents a silicon nitride film having an excess silicon composition, compared with the portion of a large bandgap. The dielectric constant of silicon $\epsilon_{Si}$ is about 12, that of silicon dioxide $\epsilon_{SiO_2}$ is about 4 and that of silicon nitride $\epsilon_{SiN}$ is about 7. As silicon becomes excess, $\epsilon_{SiN}$ becomes large.

In order to make the band structure of the silicon nitride film 106 as in FIG. 2A, for example, by a chemical vapor deposition method, the ratio between the flow rate of a silicon material gas such as monosilane ($SiH_4$) or dichlorsilane ($SiH_2Cl_2$) and the flow rate of ammonia ($NH_3$) is varied; that is, the flow rate of $NH_3$ is made sufficiently higher than the flow rate of the silicon material gas such as $SiH_4$ or $SiH_2Cl_2$, near both the tunnel insulating film 105 and the silicon oxide film 107 to produce each composition close to the stoichiometric value. And near the middle of the film thickness, the flow rate of $NH_3$ may be reduced than the flow rate of the composition of the material gas such as $SiH_4$ or $SiH_2Cl_2$, or the reaction temperature may be lowered so as to produce excess silicon, where the terms "the composition close to the stoichiometric value" and "the composition of excess silicon" show relative compositions and do not necessarily show absolute ones. In other words, the composition ratio of silicon of the silicon nitride film 106 is reduced at least at the interface with the tunnel insulating film 105, compared with that near the middle of the film thickness of the silicon nitride film 106. Also, in order to make the silicon nitride film 106 into the band structure as shown in FIG. 2B, near the tunnel insulating film 105, the flow rate of $NH_3$ is increased enough beyond the flow rate of $SiH_4$ or $SiH_2Cl_2$, and then the flow rate of $NH_3$ is decreased, thereby controlling the flow rate so as to form a film of excess silicon.

Figure 2C:
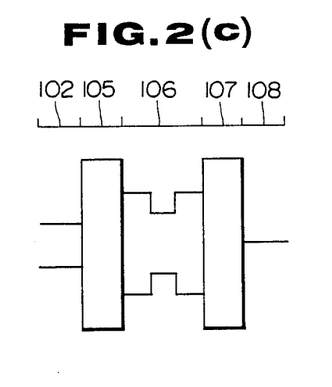
Figure 2D:
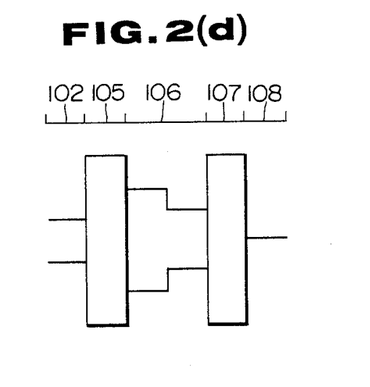

In FIGS. 2A and 2B, each band structure of the silicon nitride film 106 is gradually varied but may be varied stepwise as in FIGS. 2C, and 2D.

Figure 3:
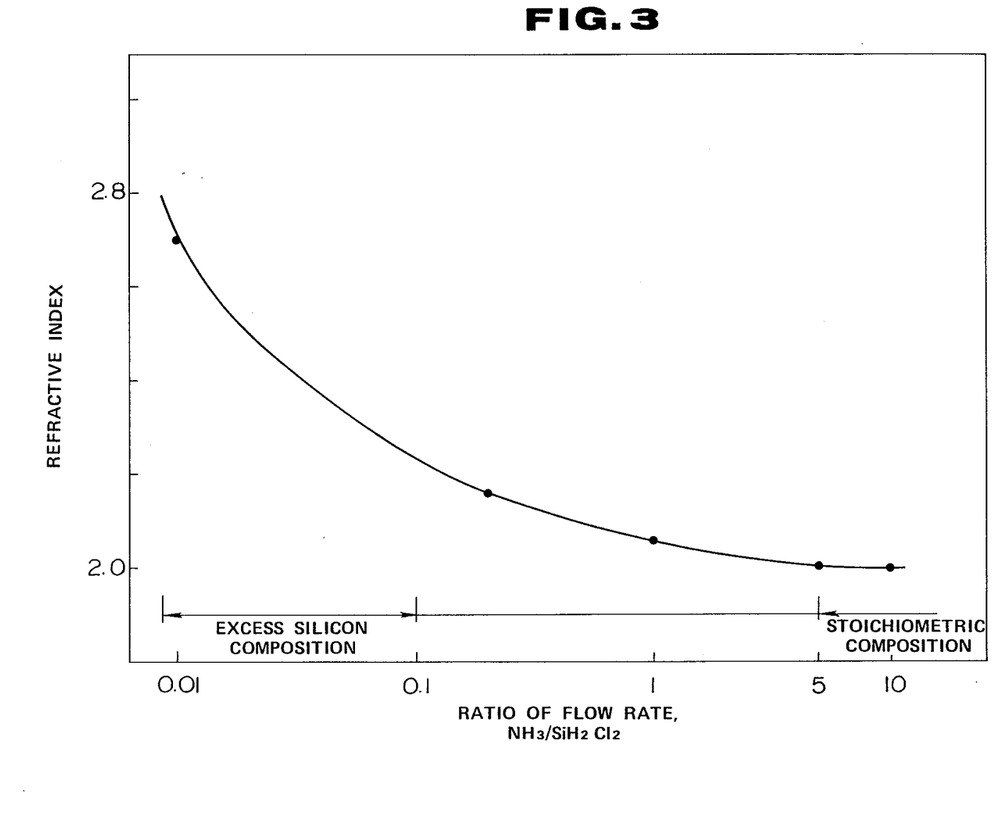
FIG. 3 is a graph for showing the relation between a refractive index and a flow rate ratio of $NH_3/SiH_2Cl_2$.

FIG. 3 shows the relation between a refractive index and a flow rate ratio (logarithmic scale between $NH_3$ and $SiH_2Cl_2$) when the ratio between the flow rate of $NH_3$ (ammonia) and the flow rate of $SiH_2Cl_2$ (dichlorsilane) is varied in forming the silicon nitride film 106 ($SiN_x$) of the present invention. In this graph, the range of stoichiometric compositions represents the region in which the ratio between the flow rate of $NH_3$ and the flow rate of $SiH_2Cl_2$ is 5 or more, and the range of excess silicon compositions represents the region in which the flow rate ratio is 0.1 or less. As it is clear from this graph, the refractive index shows a tendency to become higher as the amount of silicon increases. Although not shown in this graph, it is experimentally proved that the bandgap of silicon nitride is about 5.1 eV at the stoichiometric composition region and decreases as the stoichiometric composition becomes the excess silicon composition. Also the dielectric constant is about 7 at the stoichiometric composition region and increases as silicon becomes excess. The structures of FIGS. 2A, 2B, 2C and 2D of the present invention have been fabricated on the basis of such experimental data. The writing and erasing characteristics of the nonvolatile memories thus produced are shown in FIG. 4.

Figure 4:
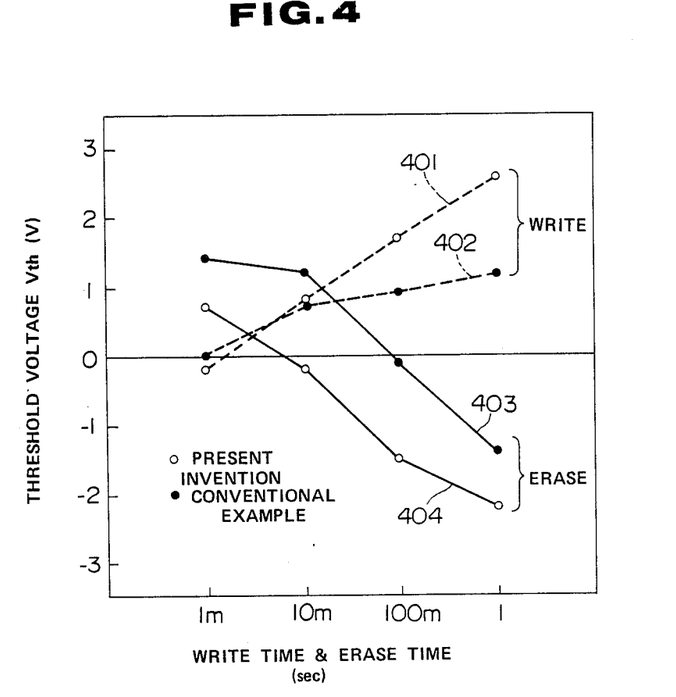
FIG. 4 is a graph for comparing the writing and erasing characteristics of the structure of the present invention with those of the conventional structure using uniformly a silicon nitride film close to a stoichiometric composition.

FIG. 4 shows the writing and erasing characteristics of the n-channel MONOS type memory transistor of the band structure shown in FIG. 2A, and the relation between the writing/erasing time (logarithmic scale) and the threshold voltage of the transistor, when the writing voltage is +9 V and the erasing voltage is −9 V. By comparison with the writing and erasing characteristics of the conventional n-channel MONOS type memory transistor using a uniform composition silicon nitride film close to the stoichiometric composition; for the writing time required to change the threshold voltage (Vth) from a sufficient depletion state (Vth: minus) to an enhancement state (Vth: plus), as viewed from characteristics 401 and 402, both are of the order of several milliliseconds and make no difference; while for the erasing time required to change the threshold voltage (Vth) from a sufficient enhancement state to a depletion state, as viewed from characteristics 403 and 404, the transistor of the conventional structure takes more than 100 milliseconds, while the transistor using the structure according to the present invention takes only 10 milliseconds or more and thus makes it possible to speed up the erasing speed greatly.

Figure 5:
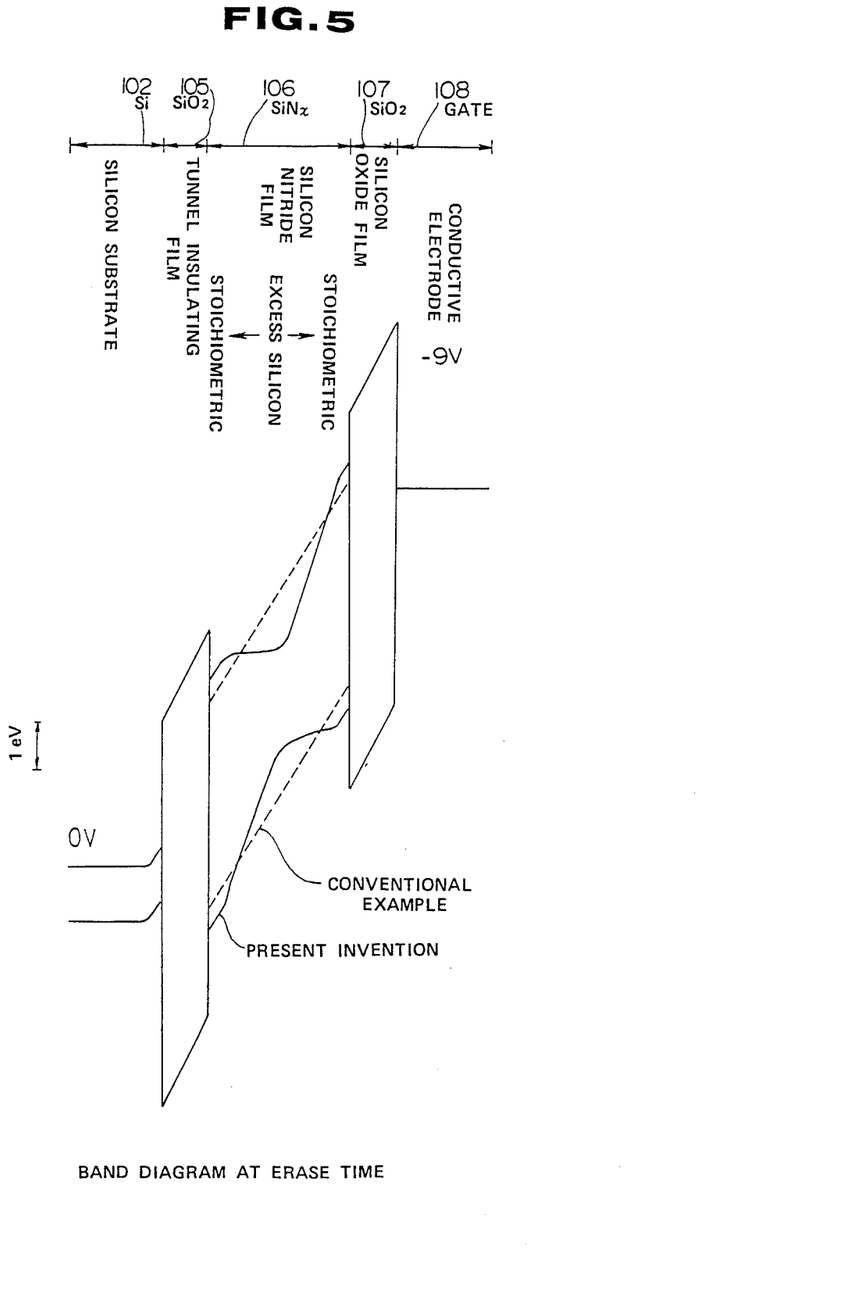
FIG. 5 is a band diagram of the MONOS memory transistor having the band structure shown in FIG. 2A at the time of its erase operation.

FIG. 5 is a band diagram of the MONOS memory transistor having the structure of FIG. 2A at the time of erase operation. The silicon nitride film shown in FIG. 5 has a large trap amount and a high dielectric constant compared to the conventional silicon nitride film.

The effective thickness of the silicon nitride film of the present invention is expressed as the value of the film thickness converted to that of $SiO_2$ as follows:

Assuming that the dielectric constant of silicon nitride is $\epsilon_{SiNx}$ (=7 for stoichiometric composition), the dielectric constant of silicon dioxide is $\epsilon_{SiO2}$ (=3.9), the film thickness of silicon nitride is $t_N$, and the film thickness of silicon nitride converted to that of $SiO_2$ is t, the following equation is obtained:

$$t = \epsilon_{SiO2} \times t_{ox} / \epsilon_{SiNx}$$

Since $\epsilon_{SiN}$ is large, the effective film thickness of silicon nitride is small.

Therefore, although the film thicknesses of the first gate insulating film (tunnel insulating film) and the third gate insulating film (silicon oxide) are unchanged, the film thickness of the silicon nitride converted to $SiO_2$ used as the second gate insulating film is reduced, thereby reducing the total equivalent gate insulating film thicknesses.

As shown in this figure, when a potential difference, say, 9 V is applied as the erasing voltage across the channel forming semiconductor region 102 and the gate electrode 108, the erasing speed increases because the film thickness of the silicon nitride film converted to that of $SiO_2$ is reduced, and the electric field assigned to the tunnel insulating film 105 is increased accordingly. Of course, the writing speed also increases, but the dependence of the writing speed upon the tunnel insulating film thickness is small compared to the dependence of the erasing speed upon the tunnel insulating film thickness and thus the increase in the writing speed is not so remarkable as the increase in the erasing speed.

Figure 6:
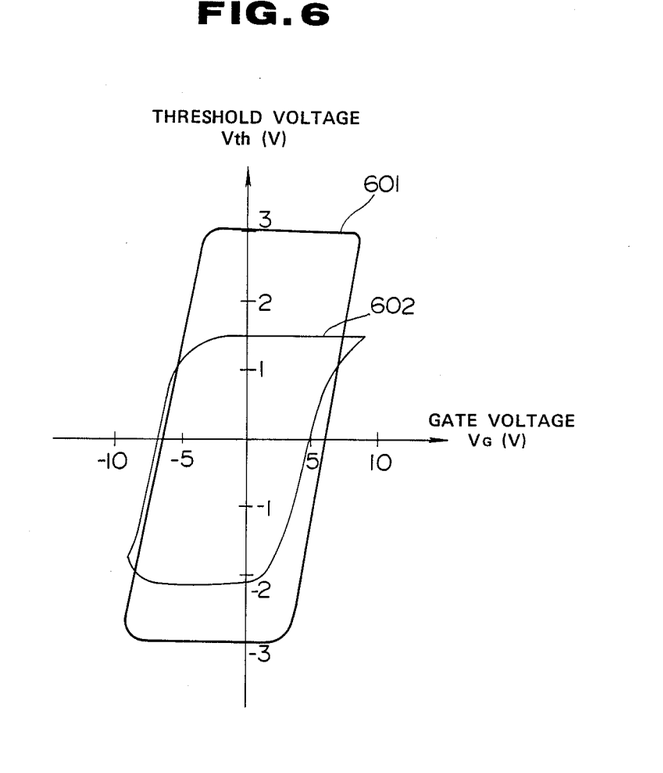
FIG. 6 is a graph for comparing hysteresis loops of the present invention and the conventional example.

FIG. 6 shows hysteresis loops of the nonvolatile memory of the band structure shown in FIG. 2A and the memory of the conventional structure. Making a comparison between the hysteresis loop 601 of the memory according to the present invention and the hysteresis loop 602 of the memory of the conventional structure, the present invention increases a so-called memory window width (width of information between "1" and "0"). This is because the use of the silicon nitride film composed of excess silicon increases the amount of memory traps (trap density).

In addition, the use of the structure according to the present invention increases the memory retention characteristics of electric charges.

As it is clear from FIG. 2A and FIG. 5, the trap potential is lowest near the middle of the film thickness. Moreover its potential well is so deep that the charges captured near the middle of the film thickness do not move to the silicon substrate 102 side by reverse tunneling, thus also improving the memory retention characteristics.

Figure 7:
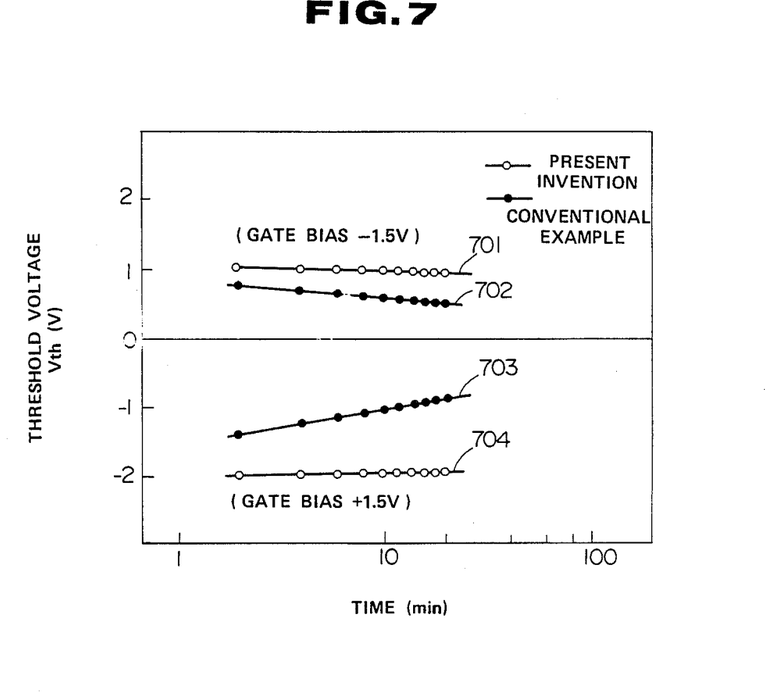
FIG. 7 is a graph for comparing memory retention characteristics of the present invention and the conventional example.

FIG. 7 shows a comparison between the memory retention characteristics of the memory of the band structure shown in FIG. 2A and those of the memory of the conventional structure. the use of the structure according to the present invention, it is noted that the memory retention characteristics can also be enhanced because the slope of characteristic curve 701 is gentler than the slope of characteristic curve 702, and 704 is gentler than 703.

In the experiment of the above embodiment, on a tunnel insulating film, a silicon nitride film ($NH_3/SiH_2Cl_2$ = 10 at 700° C. and 0.4 mbar) close to the stoichiometric composition is deposited to a thickness of about 7 nm; then a film of excess silicon ($NH_3/SiH_2Cl_2$ = 0.01) is deposited to a thickness of about 3 nm; a silicon nitride film ($NH_3/SiH_2Cl_2$ = 10) close to the stoichiometric composition is deposited to about 7 mn; and then the composed silicon nitride film is thermally oxidized at 950° C. to produce the silicon oxide film, thus forming the memory structure. Also, in a series of experiments including the above embodiment, for the formation of the silicon nitride film close to the stoichiometric composition, it is preferable that $NH_3/SiH_2Cl_2$ = 5 or more, silicon nitride film which seems to comprise excess silicon, it is preferable that $NH_3/SiH_2Cl_2$ = 0.1 or less.

In this connection, like the memory of the band structure of the present invention as in FIG. 2B or 2D, even if a silicon oxide film produced by thermally oxidizing silicon nitride film 106 composed of excess silicon is used as the silicon oxide film 107, there is no possibility of pin holes, and an electrical insulation is sufficiently high. Therefore, it is possible to deposit efficiently electric charges onto the silicon nitride film 106, and also as in FIGS. 2A and 2C, the effect of the present invention can be obtained.

In the above embodiment, a silicon oxide film about 2.8 nm in thickness has been used as the tunnel insulating film. However, oxynitride produced by thermally oxidizing a thermal nitride film or thermally nitriding an oxide film can also produce the effect of the present invention. As for the silicon oxide film, not only by thermal oxidization of a surface portion of the silicon nitride film 106 but also a deposited film by a method such as chemical vapor deposition can be used. Also, although a polysilicon thin film has been used as a conductive electrode, a metal film or a conductive silicide film may be used, and needless to say, the present invention is applicable to a p-channel transistor.

As mentioned above, in comparison with the conventional example, the nonvolatile semiconductor memory according to the present invention gets a higher erasing speed and better memory retention characteristics. That is to say, in the nonvolatile semiconductor memory, the high speed and the long life have been realized.

What is claimed is:

1. A MONOS type nonvolatile semiconductor memory comprising:
   a channel forming semiconductor region between source and drain regions in a surface of a substrate;
   a tunnel insulating film formed as a first insulating layer on said channel forming semiconductor region in the substrate, said tunnel insulating film permitting charge-injection;
   a silicon nitride film formed as a second insulating layer on said tunnel insulating layer;
   a silicon oxide film formed as a third insulating layer on said silicon nitride film; and
   a conductive electrode formed on said silicon oxide film;
   said silicon nitride film having a composition close to a stoichiometric value of $Si_3N_4$ at a portion near an interface with said tunnel insulating film and at a portion near an interface with said silicon oxide film, and having a composition of excess silicon more than the stoichiometric value of $Si_3N_4$ at a portion near the middle of the silicon nitride film.

2. A MONOS type nonvolatile semiconductor memory comprising:
- a channel forming semiconductor region between source and drain regions in a surface of a substrate;
- a tunnel insulating film formed as a first insulating layer on said channel forming semiconductor region in the substrate, said tunnel insulating film permitting charge-injection;
- a silicon nitride film formed as a second insulating layer on said tunnel insulating film;
- a silicon oxide film formed as a third insulating layer on said silicon nitride film; and
- a conductive electrode formed on said silicon oxide film;
- said silicon nitride film having a composition close to a stoichiometric value of $Si_3N_4$ at a portion near an interface with said tunnel insulating film, and having a composition of excess silicon more than the stoichiometric value of $Si_3N_4$ at a portion near an interface with said silicon oxide film.

3. A MONOS type nonvolatile semiconductor memory according to claim 1 or 2, wherein the concentration of silicon of a region between the portion having a composition close to the stoichiometric value of $Si_3N_4$ and the portion having the composition of excess silicon more than the stoichiometric value of $Si_3N_4$ varies gradually.

4. A MONOS type nonvolatile semiconductor memory according to claim 1 or 2 wherein the concentration of silicon of a region between the portion having the composition close to the stoichiometric value of $Si_3N_4$ and the portion having the composition of excess silicon more than the stoichiometric value of $Si_3N_4$ varies in a stepwise way.

* * * * *